NON-SATURATING DIRECT COUPLED TRANSISTOR LOGIC CIRCUIT

Filed Nov. 29, 1961

2 Sheets-Sheet 1

INVENTORS
FRED K. BUELOW
JOHN R. TURNBULL, JR.

BY Joseph C. Redmond Jr.

ATTORNEY

United States Patent Office 3,235,754
Patented Feb. 15, 1966

3,235,754
NON-SATURATING DIRECT COUPLED TRANSISTOR LOGIC CIRCUIT

Fred K. Buelow, Poughkeepsie, and John R. Turnbull, Jr., Wappingers Falls, N.Y., assignors to International Business Machines Corporation, New York, N.Y., a corporation of New York Filed Nov. 29, 1961, Ser. No. 155,583
11 Claims. (Cl. 307—88.5)

This invention relates to transistor amplifiers and more particularly, to transistor amplifiers arranged in switching circuits.

Transistor amplifiers are one, if not the most, basic circuit elements employed in computer systems. Amplifiers, in such systems, are usually operated cut-off with both the emitter-base and collector-base junctions being polarized so that they are reverse biased. One or more input signals of suitable magnitude and representative of a logical statement are adapted to forward bias the emitter-base junction so that the transistor conducts. The change in collector voltage is transmitted to the next transistor stage as a new input signal representative of another logical statement. On release of the input signal, the transistor is returned to the cut-off condition. To speed turn-on of the transistor, it is desirable to overdrive the input signal, but the overdriven input usually creates excess minority carriers in the base which delays turn-off.

For high speed computer circuits, the delay in turn-off introduced by the excess minority carriers, precludes amplifier operation at speeds of the order of 1 nanosecond presently required for high speed computer circuits. Various circuit means have been proposed in the art to prevent excess minority carriers or saturation of the amplifiers. A number of these techniques are disclosed in an article entitled Comparison of Saturated and Non-Saturated Switching Circuit Techniques which appeared in the IRE Transactions on Electronic Computers, June 1960, pages 161 through 171.

Numerous arrangements have also been developed to connect amplifiers together to form a computer system. One requirement for high speed computer systems is that the passive elements be eliminated or at least minimized since these elements introduce relatively long circiut delays into the computer systems. Preferably, the transistors or active elements should be directly connected together. One direct coupling technique is possible in a current mode scheme described by U.S. Patent No. 2,964,652 assigned to the same assignee as that of the present invention. Another alternative for direct coupling of transistors is a voltage mode scheme as illustrated by U.S. Patent No. 2,967,951 to R. B. Brown. The present invention has particular, but not exclusive, reference to both of these schemes.

Normally, coupling of transistors requires passive elements to be interposed between the transistors for signal translation reasons. Such elements translate the voltage levels of the signal so that a signal can be propagated through a chain of circuits. The R. B. Brown patent previously cited eliminates the passive elements connected between the amplifiers. The switching speed of the Brown circuit, however, is relatively slow due to the transistors being operated in saturation when a turn-on input signal is received. Retaining the transistors of the Brown circuit out of saturation by the known means described in the above-mentioned IRE article would require an additional impedance element in the circuit thereby precluding direct coupling of the amplifiers. Also, such an element usually introduces a circuit delay comparable to the time advantage obtained by removing the transistors from saturation.

It is desirable, therefore, to develop a circuit that will permit amplifiers to be directly connected together and operated non-saturating for a variety of purposes, preferably computer systems. It is further desirable that such a circuit be suitable for manufacture as a single integrated device.

A general object of the invention is an improved transistor amplifier for use in high speed computers, the amplifier operating at switching speeds of the order of 1 nanosecond and suitable for manufacture in integrated circuit form.

Another object is a transistor amplifier that may be directly coupled to another amplifier so that both will be operated in a non-saturated condition.

One object is a transistor amplifier having low power dissipation and providing amplification for collector-base voltages of both polarities.

Another object is a transistor amplifier having logic versatility at operating speeds of the order of 1 nanosecond.

Another object is a transistor amplifier that permits high density packaging in a relatively small volume.

Another object is a direct coupled transistor logic circuit which provides transistor action without saturation.

Another object is a transistor amplifier that can be coupled to other amplifiers without intervening voltage translation means.

These and other objects are accomplished in the present invention, one illustrative embodiment of which comprises a transistor, typically arranged in the common-emitter circuit configuration, and including suitable means to limit the emitter current or the base and collector voltage swings. The transistor is characterized by a family of operating curves having three different regions of collector-to-base voltage versus collector current where each curve is for a different emitter current. One region, normally referred to as the reverse-bias collector region, has a constant collector current for each emitter current over a first preselected range of collector voltage polarity. A second region has useful current gain for each emitter current over a second preselected voltage range but of a collector polarity different from the polarity of the first preselected voltage range and wherein minority carrier density at the collector-base junction is only slightly greater than zero. A third region is defined by one boundary of the collector voltage for the second region and a second boundary defined by the collector voltage for a specifiic emitter current where the collector current goes to zero, such a point being where the minority carrier density at the collector-base junction is nearly the same as that at the emitter-base junction of the amplifier. Operation in this region shall hereinafter be referred to as operation in saturation. Both second and third regions of the transistor are referred to as forward-biased regions, but in one the collector has excess minority carriers whereas in the other there is only a very slight degree of excess minority carriers. The characteristics of the first and second regions are central to the present invention in that the transistor amplifier can be operated non-saturated and yet provide amplification of an input signal to turn off a subsequent transistor provided either the emitter current or the collector-base voltage swing is controlled. Such a feature permits the amplifier to be directly coupled to a subsequent transistor without the requirement of intervening voltage translation means. Additionally, the controlled emitter current or collector swing and the omission of voltage translation means permits the use of relatively low power supplies so that power dissipation of the amplifier is low thereby permitting a large quantity of amplifiers to be packed in a relatively small volume. The latter feature is particularly attractive from an integrated or solid logic circuit standpoint.

One feature of the invention is an amplifier having a particular operating characteristic such that when suitably employed, a logic circuit is provided with considerable versatility, low power dissipation and switching speeds of the order of 1 nanosecond.

Another feature is an amplifier having a family of operating curves that provides amplification with a forward-biased collector such that an input signal may be employed to turn off a subsequent directly coupled transistor without saturation of the amplifier receiving the input signal.

Another feature is an amplifier having a controlled input signal swing or emitter current which in combination with operating characteristic of the transistor provides nonsaturated switching of the transistor and an output signal sufficient to turn off a subsequent directly coupled transistor amplifier.

Another feature is a plurality of amplifiers directly connected together so that an input will cause opposite switching of contiguous amplifiers without either amplifier saturating.

Another feature is an amplifier having a controlled signal swing or emitter current that may be employed as a basic logic circuit in a computer system.

Still another feature is a non-saturating direct coupled transistor logic circuit that has a controlled signal, low power dissipation and a structural configuration suitable for manufacture in integrated circuit form.

The foregoing and other objects, features and advantages of the invention will be apparent from the following more particular description of preferred embodiments of the invention, as illustrated in the accompanying drawings.

Figure 1:
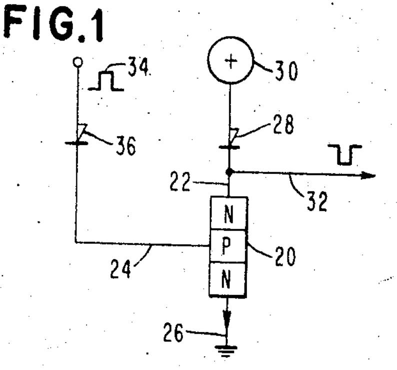
FIG. 1 is an electrical schematic of one embodiment of an amplifier employing the principles of the present invention.

Referring to FIG. 1, one illustrative embodiment of the present invention includes a transistor 20 connected in the common-emitter configuration and having a collector electrode 22, a base electrode 24 and an emitter electrode 26 which is connected to a reference potential, typically ground. The collector 22 is connected through an impedance element 28 to a voltage supply 30 of suitable polarity depending upon the type of transistor employed in the circuit. An output terminal 32 is connected to the common point between the impedance element 28 and collector 22. An input signal 34 is supplied through suitable impedance means 36 to the base electrode 24. In the absence of the input signal 34, the emitter-base junction of the transistor 20 is very slightly forward biased which results in the transistor being essentially cut off and an output signal level approaching the magnitude of the supply 30. When the input signal 34 is applied to the circuit, the transistor conducts and the output signal level changes to provide an output signal approximately equal in magnitude to that of the input signal. The potential at the collector 22 does not fall to the reference potential connected to the emitter due to the characteristics of the transistor and the impedance element 28. Before describing the use of the circuit for logical purposes it is believed in order to describe the characteristics of the transistor.

Figure 2:
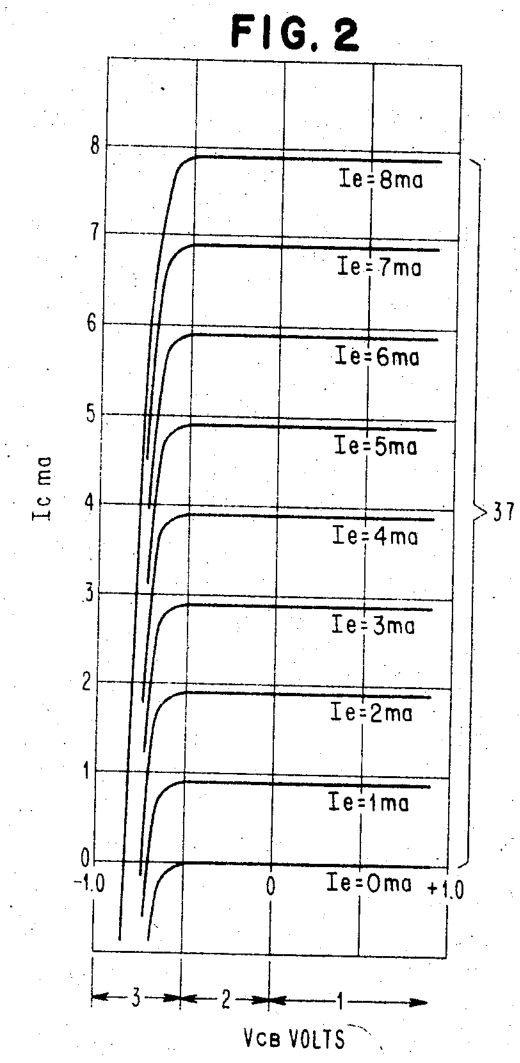
FIG. 2 is a graph of collector-to-base voltage versus collector current for a transistor such as is employed in FIG. 1.

Referring to FIG. 2, a plurality of operating curves 37 are shown for the transistor employed in the circuit of FIG. 1. The graph has collector-to-base voltage as one axis and collector current as the other axis. Each operating curve is for a different emitter current. Indicated on the graph are three different voltage ranges for each operating curve. The first operating range designated by the numeral 1 has a constant collector current for each emitter current. A second range designated by the numeral 2 has essentially constant collector current and, therefore, useful current gain for each emitter current over a second preselected range of voltage. The range of voltage in the second region, however, is of a different polarity than that for the first range. One other factor which can be inferred from the graph should be noted. In the second region the collector-base junction is forward biased, but the minority carrier density at the junction is only slightly greater than zero. Thus, transistors can be switched in this region without the attendant restrictions of saturation. A third range shown on the graph and designated by the numeral 3 completes the operating characteristic of the transistor. One boundary of the numeral 3 region is the collector voltage terminating the numeral 2 region and contiguous to the numeral 3 region. The second boundary is defined by the collector voltage for the emitter current of interest where the associated collector current goes to zero. The second boundary defines a point where the minority carrier density at the collector-base junction nearly approximates that density appearing at the emitter-base junction of the transistor. This region defines the saturation condition for the transistor, i.e., the excess minority carriers in the base will increase the turn-off time of the device, reduce the current gain (i.e., the constant current characteristic) and drastically reduce the gain bandwidth product of the transistor. Both the second and third regions are referred to as forward-biased regions, but in the former the slight degree of minority carriers, if any, has little or no effect on circuit operation whereas in the other, the excess minority carriers retard the turn-off time and other qualities of the device, previously noted. Transistors having characteristics defined by the graph shown in FIG. 2 are available on the commercial market. The present invention has used a Fairchild Transistor Type 2N709 with considerable success, but it should be understood that the invention is not limited to this particular type.

Transistors similar to the 2N709 have 1K mc. bandwidths and intrinsic time constants of .1 to .3 nanosecond. In a circuit configuration the external circuit parameters will usually have much slower time constants and, therefore, prevent the realization of full transistor potential. The circuits herein described have two general high speed features:

(1) Signal swings are very small and the circuits are direct coupled. This means that current available on the output of one circuit can directly drive the next cricuit instead of charging capacitive or being attenuated through various voltage attenuation means.

(2) The power level is low and relatively few components are used which permits very close packaging of circuits. The result of this is that both propagation delay between circuits as well as the loading effects of stray capacitance and inductance are greatly reduced.

These features permit the achievement of 1 nanosecond delays.

Figure 3:
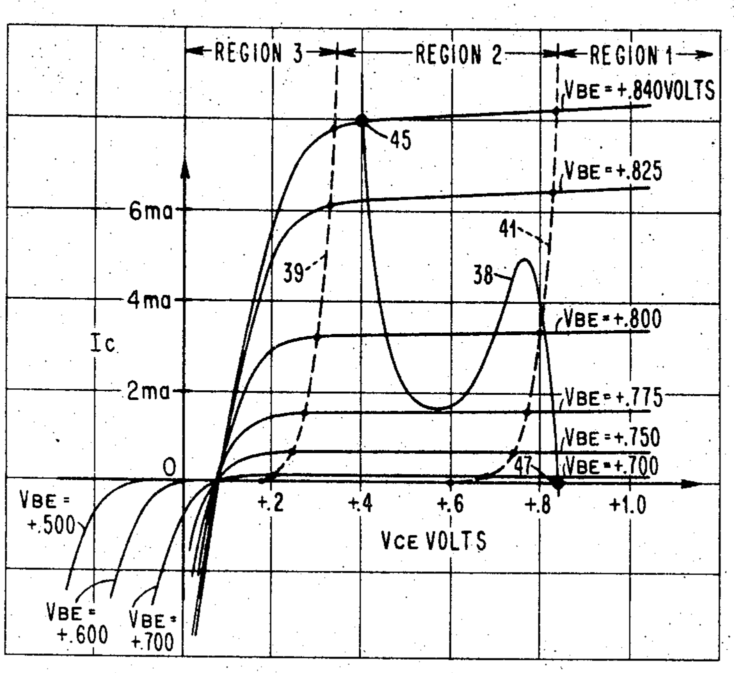
FIG. 3 is a graph of collector-to-emitter voltage versus collector current for the transistor employed as a common-emitter amplifier in FIG. 1.

One essential consideration in the invention is the limitation of the collector swing so that operation of the transistor takes place in the regions 1 and 2. Collector-to-base voltage can be limited to these regions by several techniques. One technique is to limit the collector voltage and base voltage swings through suitable impedance elements. The impedance elements may have either linear or non-linear characteristics. One impedance element used with success is a tunnel diode which has two stable conditions and when employed as a collector impedance element 28 in conjunction with a controlled base swing limits the collector-base swing within the required discrete intervals (1 and 2). Tunnel diodes are well known in the art being described, for example, in an article appearing in the Physical Review, vol. 109, 1958, by L. Esaki, pages 602, 603. Looking at the output terminal 32 with a tunnel diode as the collector impedance element 28 produces a load line 38 on the graph shown in FIG. 3. The graph shows the grounded emitter characteristic of a transistor with constant base voltage as a parameter. FIG. 3 better describes the operation of the circuit than FIG. 2 which is the common base characteristic of the transistor. The boundaries between regions 1, 2 and 3 have been indicated on the graph by the dotted lines 39 and 41. The boundaries are obtained by subtracting the corresponding base and collector voltages. It will be noted that the load line 38 presented by the tunnel diode 28 resides within the regions 1 and 2. The intersection of the load line with the appropriate constant base voltages establishes the operating points for the transistor. In the present case, assuming the tunnel diode is connected to a positive supply of .84 volt, a positive voltage of .84 volt applied to the base will cause the transistor to turn on and the collector voltage will be .4 volt as shown by an operating point 45. When a positive .4 volt is applied to the base, the transistor will turn off and an operating point 47 will be established which results in a positive output voltage of .84 volt. Clearly, the input and output voltage levels are interchanged by the circuit. Thus, when the transistor is off, the output signal is insufficient to turn on a subsequent transistor, and when the transistor is on, the output signal is sufficient to turn on a subsequent transistor. Hence, such an amplifier could drive a similar amplifier without intervening elements. Additionally, since the operating point 45 is in region 2, the transistor is out of saturation and the ill effects of saturation are avoided.

Heretofore, as in the Brown patent previously cited, the collector voltage of a first transistor when turned on would change sufficiently to turn off a second or subsequent transistor but the first transistor would saturate. As a consequence, the switching speed of the circuit is relatively slow. Now the circuit of the present invention may be directly coupled to a subsequent transistor so that when an input signal is received, neither transistor saturates nor requires voltage translation means. FIG. 1 is a typical of one of a plurality of amplifiers arranged for direct coupling and wherein the impedance element 36 which corresponds to 28 in a previous transistor stage controls the input signal swing of the subsequent transistor.

Figure 4:
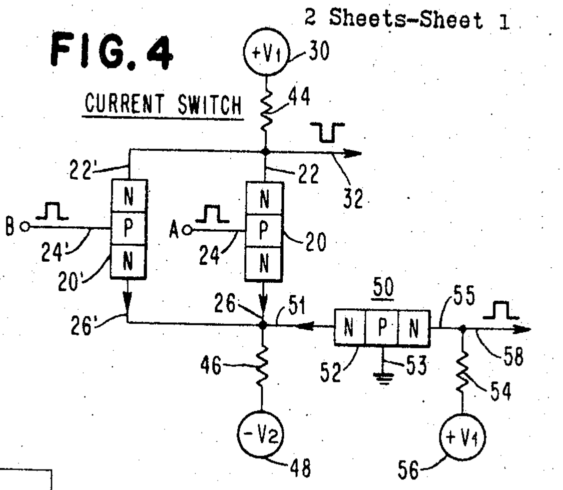
FIG. 4 is an electrical schematic of another amplifier employing the principles of the present invention.

Another alternative for retaining the operation of the transistors in regions 1 and 2 is shown in FIG. 4. The circuit shown in FIG. 4 is similar to the circuit shown in FIG. 1. The circuit of FIG. 4, however, contains the collector-to-base voltage to regions 1 and 2 by controlling the emitter current that can flow through the transistor. Accordingly, like circuit elements in FIG. 4 to those shown in FIG. 1 will have the same reference designation.

Included in circuit of FIG. 4 are transistors 20 and 20′, the collectors and emitters thereof being tied together. Each transistor is adapted to receive an input signal A or B as the case may be. The common collector is connected through a resistor 44 to the voltage supply 30 of suitable polarity depending upon the type of transistor employed in the circuit. An output terminal 32 is connected to the common collector circuit. The terminal 32 provides an output signal that is the inverse of the input signal supplied to the circuit. The common emitter terminal is connected through a resistor 46 to a voltage source 48. Also, connected to the common emitter is a common base amplifier 50 including a transistor 52 having an emitter 51, a grounded abse electrode 53 and a collector 55, the latter being connected through a load resistor 54 to a voltage supply 56 of suitable polarity. An output terminal 58 is also connected to the collector 55 to provide an output signal that corresponds to the input signals supplied to the transistors 20 or 20′. The emitter of the transistor 52 is connected to the common emitters of the transistors 20 and 20′.

Figure 5:
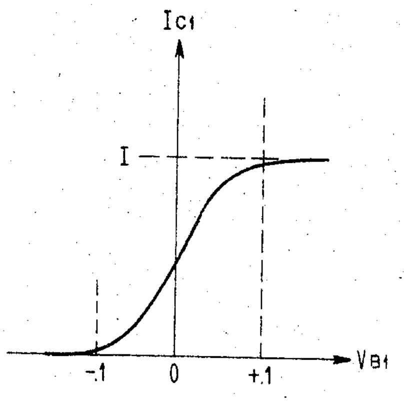
FIG. 5 is a transfer curve for the circuit of FIG. 4.

FIG. 5 shows the transfer characteristic for the transistor 20 or 20′, that is, the collector current as a function of the base voltage. From the curve, a base signal excursion of .2 volt is sufficient to cause essentially full switching of the transistor. If the supply 30 is +.1 volt and the base is −.1 volt the transistor 20 or 20′ is off and output voltage is +.1 volt. Alternatively, if the base voltage is +.1 volt, the collector current will be I shown in FIG. 5 and an appropriate resistor value chosen for collector resistor 44 will cause a voltage of −.1 volt to appear at the collector. When the transistor is off, the collector-base voltage is .2 volt reverse biased which corresponds to operation in region 1. When the transistor is on, the collector-base voltage is −.2 volt which corresponds to operation in region 2 as evidenced by referring to FIGS. 2 or 3. When the transistors 20 and 20′ are cut off, the common base amplifier 50 provides current from the source 56 through the transistor 52, the resistor 46 to the supply 48. Turn-on of either transistor 20 or 20′ supplies current from the source 30 to the emitter supply 48 in a manner similar to the current switch described in the U.S. Patent No. 2,964,652 previously cited. The controlled input signal permits a discrete amount of current to flow through the transistor, which causes a controlled voltage swing at the collector, the amount being such that the transistor does not saturate. A collector potential slightly below ground is established for the transistors and such a potential as indicated in FIGS. 2 or 3 is sufficient to turn off a subsequent transistor which is directly coupled thereto. Thus, the present embodiment, as contrasted with the embodiment shown in FIG. 1 limits the current flowing in the emitter of the transistors 20 or 20′ in the manner similar to that of a current switch. The present embodiment also provides a true and a complement signal in the output circuits 58 and 32, respectively.

It will be noted that the power supply voltages for the embodiments shown in FIGS. 1 and 4 are relatively low as compared to prior art circuits. The low power supply voltages are due, in part at least, to the limited signal swings required, the transistors non-saturating operation, and the omission of power dissipating elements between coupled amplifiers. Conveniently, therefore, large quantities of circuits shown in the present invention may be packaged in a relatively small volume without any attendant heat problems from power dissipation. As such, the present invention advantageously lends itself to manufacture in integrated circuit form.

Figures 6, 7, 8:
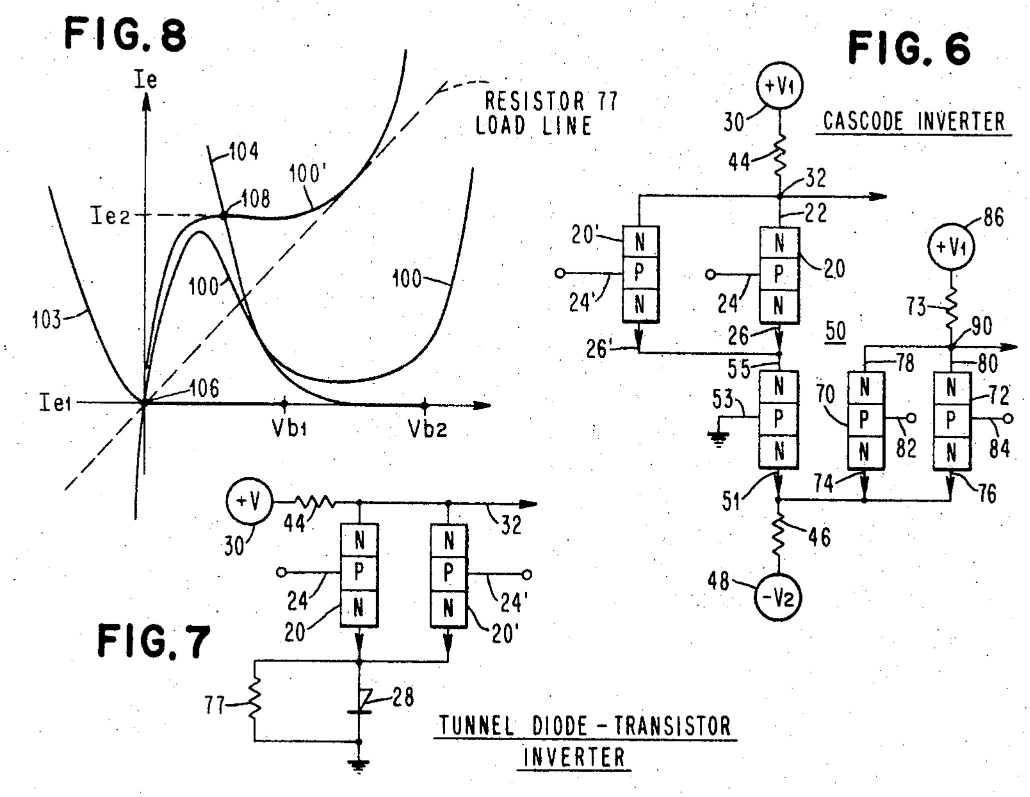
FIG. 6 is an electrical schematic of another embodiment of the present invention arranged as a cascode inverter.
FIG. 7 is an electrical schematic of still another embodiment of the present invention arranged as a NOR type circuit.
FIG. 8 shows typical operating curves for the circuit of FIG. 7.

Another embodiment of the present invention is shown in FIG. 6 wherein transistors 20 and 20′, and 50 of FIG. 4 are connected together with transistors 70 and 72 to form a cascade inverter. The transistors 70 and 72 include emitters 74 and 76; collectors 78 and 80 and base electrodes 82 and 84, respectively. The emitters 74 and 76 are interconnected and thereafter connected to the supply 48 through the resistor 46. Both transistors 70 and 72 are adapted to receive an input signal at their respective base electrodes. The collectors are also connected together, and thereafter to a supply 86 of suitable polarity through a resistor 73. An output terminal 90 is connected to the common collector circuit for the transistors 70 and 72.

Normally, the transistors 20 and 20′, 70 and 72 are biased non-conducting by the applied signal level, whereas the transistor 50 is conducting due to the base voltage thereof forward biasing the emitter-base junction. Whenever transistors 20 or 20′ are turned on, current is supplied to the transistor 50 from the supply 30 so that the voltage at the output terminal 32 falls. The voltage at the output terminal, however, is affected by the input signals applied to the transistors 70 and 72. The potential appearing at the output terminal 90 approaches that of the supply 86 until turn-on of either or both of the transistors 70 and 72 occurs. When turn-on of either transistors 70 and 72 occurs, the output at the terminal 32 is inhibited even though an input signal may be applied to the transistors 20 or 20′. The transistors 70 and 72 by-pass any current flow from the transistors 20 and 20′ so that these transistors are effectively off with the output approaching that of the supply 30. Input signals applied to the transistors 70 and 72 are only applied for inhibiting purposes and when applied, appear in inverted form at the output terminal 90. Detailed explanation of FIG. 6 is given in a previously filed application, Ser. No. 143,075 filed Oct. 5, 1961 and assigned to the assignee as that of the present invention. The circuit of this application, however, does not disclose the transistor operation of the present invention.

Another embodiment of the invention is shown in FIG. 7 wherein the circuit arrangement is substantially the same as shown in FIG. 1 except for the tunnel diode 28 being located in the emitter circuit. Connected in parallel with the diode 28 is an emitter resistor 77 which slightly alters the operating characteristic of the diode to that characteristic shown in FIG. 8.

The tunnel diode 28 has an operating characteristic 100 shown in FIG. 8. The resistor 77 alters the operating characteristic to the curve 100′. The emitter-base junctions of the transistors 20 and 20′ establish load lines 103 and 104, when the transistor is nonconducting and conducting, respectively. The intersection between the curves 103 and 104 with the curve 100′ establishes operating points 106 and 108.

The combination of the tunnel diode and resistor provides a current limiting device for the emitter current. Normally, the tunnel diode is at operating point 106 due to the negative input signal level applied to the base electrodes of the transistors 20 and 20′. As a result, little or no current flows from the input circuit through the tunnel diode to ground to retain the transistors nonconducting. When a positive input signal is applied of sufficient magnitude, the transistors 20 or 20′ are turned on which changes the voltage across the tunnel diode to switch the tunnel diode from the low current condition to the constant current condition 108 shown in FIG. 8. The diode limits current flow through the transistor to retain the collector voltage within the 2 range described in FIG. 2. Accordingly, this circuit may be directly coupled to corresponding circuits in the manner previously described. Additionally, the circuit provides inverting action without saturation and has a rapid turn-off due to the diode retaining the emitter substantially at ground thereby permitting a large turn-off current to flow.

In connection with FIGS. 4, 6, and 7 the emitter of any transistor is not returned to a fixed reference potential. The emitter potential essentially follows the base voltage and when the circuits are directly connected, such a feature does not alter the performance of the circuit. The Brown patent previously cited required the emitter potentials to be identical in successive stages in order for direct coupling to be effective. The present circuit permits the emitter potential of successive stages to be different so that greater flexibility is achieved with the present invention.

Although the present invention has shown NPN transistors in the various circuit configuration, it is believed evident that PNP transistors may be substituted in those circuits disclosed provided the necessary changes are made to the polarity of the supply voltages.

It is also believed evident that the circuits may be suitably modified to perform a NAND function instead of the NOR function presently disclosed.

Summarizing, an amplifier has been disclosed which enables direct coupling to be achieved at relatively low power dissipation rates and at high switching speeds. The feature of containing the transistor operation within a described interval by controlling collector swing or emitter current makes practicable the present direct coupled amplifier without saturation of either transistor.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A transistor amplifier comprising a transistor having base, emitter and collector electrodes, said transistor characterized by family of operating curves having three different regions of collector-to-base voltage versus collector current where each curve is for an emitter current, one region having a constant collector current for each emitter current over a first preselected range of collector voltage polarity, a second region having useful current gain for each emitter current over a second preselected voltage range but of a collector polarity different from the polarity of the first preselected voltage range and wherein minority carrier density at the collector base junction is only slightly greater than zero, a third region defined by the minimum collector voltage of the second region and all other collector potentials of the same polarity and wherein the minority carrier density at the collector base junction is nearly the same or greater than that at the emitter base junction, means for biasing the transistor for switching operation, means connected in the collector circuit for limiting operation of the transistor to the first and second regions of the family of operating curves and signal means to apply a selected one of two distinct voltage levels to the base electrode such that a change from one of said voltage levels to the other results in switching of the transistor from operation in said first region to operation in said second region of the family of operating curves.

2. The amplifier as defined in claim 1 wherein the means for limiting the operation of the transistor to the first and second regions comprises first impedance means in series with the collector electrode and second impedance means in series with the base electrode.

3. The transistor amplifier as defined in claim 2 wherein the impedance means are tunnel diodes and the amplifier is arranged in the common emitter configuration.

4. The transistor amplifier is defined in claim 3 wherein the input signal swing is restricted to a preselected magnitude and the biasing means is of the order of tenths of a volt so that the power dissipation in the amplifier is relatively low.

5. A transistor amplifier comprising a transistor having base, emitter and collector electrodes, the emitter and collector electrodes being suitably connected to voltage sources to operate normally said transistor cutoff, said transistor being characterized by an operating characteristic wherein the transistor does not saturate although the collector-to-base junction is slightly forward biased, said transistor being further characterized in that collector voltages of the transistor when conducting are above the emitter potential, impedance means connected in the collector circuit, means for applying signals of preselected voltage levels, so that the transistor will switch from the cut-off condition to the conducting condition with the collector-to-base junction forward biased but the transistor non-saturated, and means connected to said transistor to provide an output having voltage levels the same as the input voltage levels but of opposite order.

6. A transistor amplifier according to claim 5 adapted to form a switching circuit and including: a second transistor having base, emitter and collector electrodes one of which is adapted to receive an input signal, both transistors having the same operating characteristics, said output means of the other transistor being coupled to the input electrode of said second transistor, said second transistor being biased in the same manner as the other transistor such that when the other transistor switches from the cutoff condition to the conducting condition, the second transistor will switch from a conducting condition to a cutoff condition.

7. A transistor amplifier according to claim 5 including: a second transistor having a base, emitter and collector electrodes, both transistors having the same operating characteristics, said transistors being connected together at corresponding emitter electrodes and thereafter to a current supply, and means normally biasing said second transistor into a normally conducting state and simultaneously biasing the other transistor into a nonconducting state such that when said signals are applied to turn on the normally nonconducting transistor, a preselected amount of current will flow therein.

8. A transistor amplifier according to claim 5 including: a second transistor having a base, emitter and collector electrodes, both transistors having the same operating characteristics, said transistors being connected together at corresponding emitter electrodes and thereafter to a current supply, means normally biasing said second transistor into a normally conducting state and simultaneously biasing the other transistor into a nonconducting state such that when said signals are applied to turn on the normally nonconducting transistor a preselected amount of current will flow therein, and output circuit means connected to the collector of each transistor so that the inverted and true output signals appear respectively.

9. A transistor amplifier according to claim 8 including said normally nonconducting transistor being biased such that the emitter potential thereof follows the base input voltage rather than being a fixed reference potential.

10. A transistor amplifier according to claim 5 adapted as a switching circuit and further including: a second transistor having base, emitter and collector electrodes, both transistors having the same operating characteristics, second impedance means connected in series with the collector electrode of said second transistor, said output means of the other transistor being connected from the collector of the other transistor to the base of the second transistor, the emitter electrodes of both transistors being connected to a fixed potential, and biasing means connected to the respective impedance means of each of the transistors so that one transistor is normally conducting and the other transistor is normally nonconducting whereby an input signal adapted to turn on the normally nonconducting transistor will not saturate that transistor but the collector voltage therefor will be such as to turn off the normally conducting transistor.

11. A transistor amplifier according to claim 1 which further includes a tunnel diode connected to the emitter of said transistor, second impedance means connected in parallel with the tunnel diode, said second impedance means being adapted to alter the characteristics of the tunnel diode to produce a constant current region over a preselected voltage range, means connecting said tunnel diode and second impedance means to a reference potential, and an output circuit connected to the collector of said transistor.

References Cited by the Examiner

UNITED STATES PATENTS

| | | | |
|---|---|---|---|
| 2,928,011 | 3/1960 | Campbell | 307—88.5 |
| 3,090,926 | 5/1963 | Engel | 307—88.5 |

OTHER REFERENCES

Publication II: IBM Technical Disclosure Bulletin, vol. 2, No. 5, February 1960, p. 66.

Publication I: IBM Technical Disclosure Bulletin, vol. 4, No. 2, July 1961, p. 52, by Turnbull, Jr.

ARTHUR GAUSS, *Primary Examiner.*

GEORGE N. WESTBY, *Examiner.*